(12) United States Patent
Esmark et al.

(10) Patent No.: US 9,899,367 B2
(45) Date of Patent: Feb. 20, 2018

(54) INTEGRATED CIRCUIT INCLUDING LATERAL INSULATED GATE FIELD EFFECT TRANSISTOR

(71) Applicant: Infineon Technologies AG, Neubiberg (DE)

(72) Inventors: Kai Esmark, Neuried (DE); Yiqun Cao, Munich (DE); Donald Dibra, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/153,276

(22) Filed: May 12, 2016

(65) Prior Publication Data

US 2016/0336308 A1 Nov. 17, 2016

(30) Foreign Application Priority Data

May 15, 2015 (DE) .......................... 10 2015 107 680

(51) Int. Cl.
| | |
|---|---|
| *H01L 29/66* | (2006.01) |
| *H01L 27/02* | (2006.01) |
| *H01L 27/088* | (2006.01) |
| *H01L 29/10* | (2006.01) |
| *H01L 29/78* | (2006.01) |
| *H01L 29/06* | (2006.01) |

(52) U.S. Cl.
CPC ...... *H01L 27/0255* (2013.01); *H01L 27/0886* (2013.01); *H01L 29/1095* (2013.01); *H01L 29/7816* (2013.01); *H01L 29/0649* (2013.01)

(58) Field of Classification Search
CPC .................................................. H01L 27/0255
USPC .......................................................... 257/328
See application file for complete search history.

(56) References Cited

U.S. PATENT DOCUMENTS

| | | | | |
|---|---|---|---|---|
| 5,905,284 | A | * 5/1999 | Fujii | ................. H01L 21/26586 257/335 |
| 6,264,167 | B1 | * 7/2001 | Hamazawa | ......... H01L 29/7816 251/288 |
| 6,867,494 | B2 | * 3/2005 | Kameda | .................. H01L 24/49 257/723 |
| 8,853,783 | B2 | 10/2014 | Lai et al. | |
| 2002/0070412 | A1 | * 6/2002 | Mitlehner | ........... H01L 21/7602 257/401 |
| 2003/0011033 | A1 | 1/2003 | Petti | |

(Continued)

FOREIGN PATENT DOCUMENTS

| | | |
|---|---|---|
| DE | 19927727 B4 | 1/2009 |
| DE | 102012100767 A1 | 8/2012 |
| DE | 102013200649 A1 | 7/2013 |

*Primary Examiner* — Jami M Valentine
(74) *Attorney, Agent, or Firm* — Murphy, Bilak & Homiller, PLLC

(57) ABSTRACT

An embodiment of an integrated circuit includes a minimum lateral dimension of a semiconductor well at a first surface of a semiconductor body. The integrated circuit further includes a first lateral DMOSFET having a load path electrically coupled to a load pin. The first lateral DMOSFET is configured to control a load current through a load element electrically coupled to the load pin. A minimum lateral dimension of a drain region of the first lateral DMOSFET at the first surface of the semiconductor body is more than 50% greater than the minimum lateral dimension.

27 Claims, 9 Drawing Sheets

(56) References Cited

U.S. PATENT DOCUMENTS

| | | | |
|---|---|---|---|
| 2004/0056284 A1* | 3/2004 | Nagaoka | H01L 27/0207 257/253 |
| 2009/0236662 A1* | 9/2009 | Voldman | H01L 29/0619 257/337 |
| 2013/0146971 A1* | 6/2013 | Hirler | H01L 27/0255 257/334 |

* cited by examiner

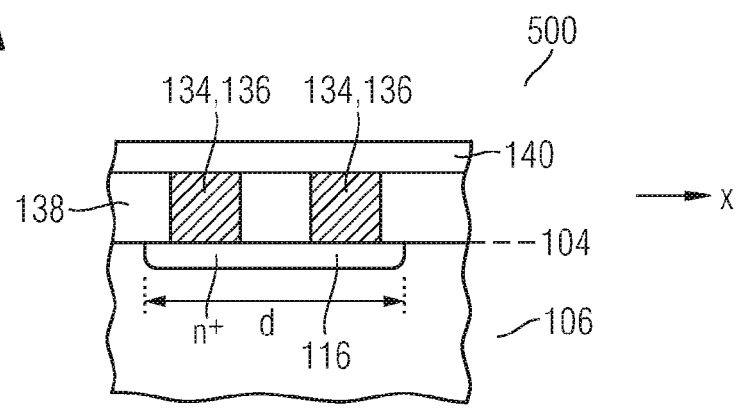
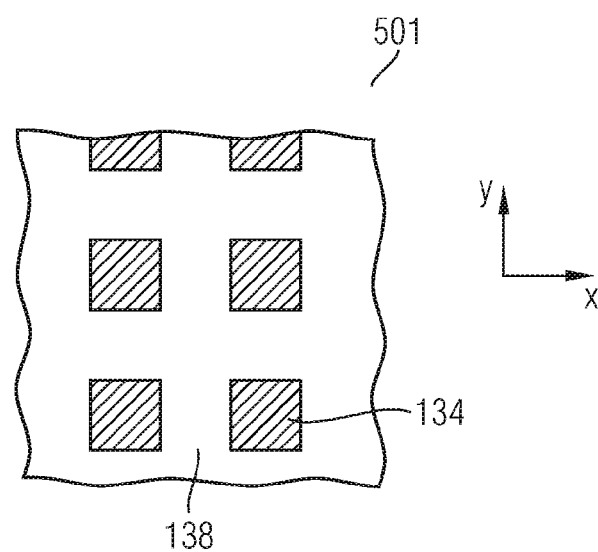
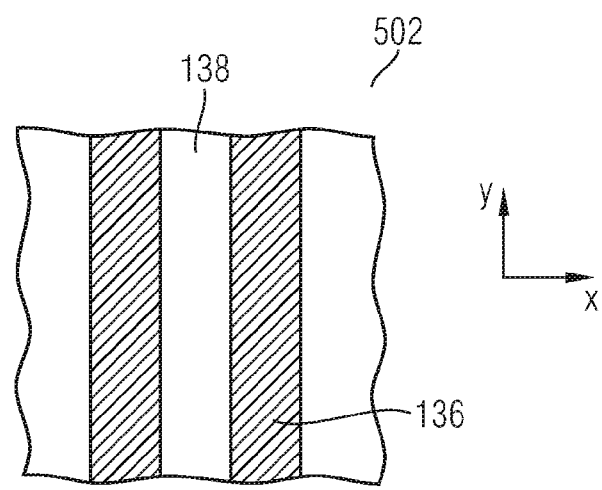

INTEGRATED CIRCUIT INCLUDING LATERAL INSULATED GATE FIELD EFFECT TRANSISTOR

PRIORITY CLAIM

This application claims priority to German Patent Application No. 10 2015 107 680.2 filed on 15 May 2015, the content of said application incorporated herein by reference in its entirety.

BACKGROUND

Voltage peaks or voltage pulses, for example voltage pulses caused by electrostatic discharge (ESD) or electrical overstress (EOS), can lead to damage or to degradation of reliability in discrete semiconductors or in integrated circuits (ICs) comprising a plurality of semiconductor elements in a common semiconductor body such as a semiconductor die. Voltage peaks may be caused by electrical charge, for example charge which may result from an ESD event. In the case of an ESD event, circuit elements around a pin where a discharge current is introduced may be forced into extreme operating conditions, for example electric breakdown. This may lead to undesired damage of circuit elements, for example melting of semiconductor or metal regions and/or gate oxide degradation or breakdown. Protection elements such as ESD structures may be connected between circuit pins for protecting circuit blocks against damage caused by ESD events. Insulated gate field effect transistors (IGFETs) such as lateral double diffused metal oxide semiconductor field effect transistors (lateral DMOSFETs or LDMOSFETs) at circuit pins, for example transistors having a low on-state resistance for switching load currents may also be capable of absorbing discharge currents without damage, for example due to their size, design and/or upstream driver circuits. When applying self-protecting LDMOSFETs to an integrated circuit, chip area saving may be achieved by omitting ESD structures at related circuit pins.

It is desirable to improve self-protection of LDMOSFETs.

SUMMARY

The present disclosure relates to an integrated circuit comprising a minimum lateral dimension of a semiconductor well at a first surface of a semiconductor body. The integrated circuit further comprises a first lateral DMOSFET comprising a load path electrically coupled to a load pin. The first lateral DMOSFET is configured to control a load current through a load element electrically coupled to the load pin. A minimum lateral dimension of a drain region of the first lateral DMOSFET at the first surface of the semiconductor body is more than 50% greater than the minimum lateral dimension dm.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

FIG. 5A is a schematic cross-sectional view illustrating a drain region of a lateral DMOSFET.

FIGS. 5B and 5C are exemplary top views of the drain region of the lateral DMOSFET of FIG. 5A.

DETAILED DESCRIPTION

Figure 1:
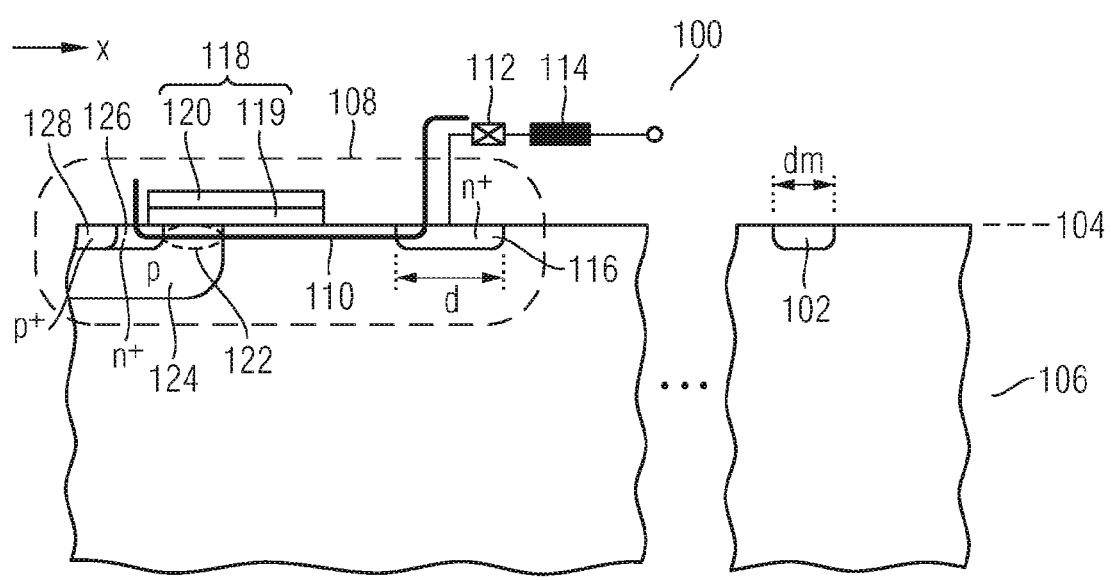
FIG. 1 is a schematic cross-sectional view of a semiconductor body including a lateral. DMOSFET constituting part of an integrated circuit according to an embodiment.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in con unction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element (s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer (s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (FVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the semiconductor wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

The schematic cross-sectional view 100 of FIG. 1 illustrates part of an integrated circuit.

The integrated circuit includes a minimum lateral dimension dm of a semiconductor well 102 at a first surface 104 of a semiconductor body 106.

A first lateral DMOSFET 108 comprises a load path 110 electrically coupled to a load pin 112. The first lateral DMOSFET 108 is configured to control a load current through a load pin 112. A minimum lateral dimension d of a drain region 116 of the first lateral DMOSFET 108 at the first surface 104 of the semiconductor body 106 is more than 50% greater than the minimum lateral dimension dm. The minimum lateral dimension din may be the minimum lateral dimension of a semiconductor well which is limited by lithography during front-end-of-line (FEOL) processing.

The first lateral DMOSFET 108 may further comprise a planar gate structure 118 including a gate dielectric 119 on the semiconductor body 106 at the first surface 104 and a gate electrode 120 on the gate dielectric 119. By altering a voltage applied to the gate electrode 120, a conductivity in a channel region 122 adjoining the gate dielectric 119 at the first surface 104 may be switched or changed between an on-state and an off-state, thereby controlling a load current through the load element 114.

The first lateral DMOSFET 108 further includes a body region 124 and a source region 126. A highly doped body contact region 128 may be arranged for improving an ohmic contact to the body region 124.

The semiconductor well 102 may be part of any circuit element of the integrated circuit. Examples of further circuit elements in the semiconductor body 106 of the integrated circuit include resistors, capacitors, inductors, diodes, transistors such as bipolar junction transistors (BJTs), IGFETs, insulated gate bipolar transistors (IGBTs), silicon controlled rectifiers, and any further circuit element that may be integrated into the semiconductor body 106 for achieving a desired circuit functionality. It is to be noted that the cross-sectional views of the lateral DMOSFETs at the semiconductor well 102 may be taken at different intersection lines.

In the cross-sectional view 100, the first lateral DMOSFET 108 is a low-side n-channel LDMOSFET with the load pin 112 being electrically coupled to the drain region 116. In some other embodiments, the lateral DMOSFET may be a high-side n-channel LDMOSFET with the load pin 112 being electrically coupled to the source region 126. In some other embodiments, the lateral DMOSFET may be low-side or high-side p-channel LDMOSFET. The high- and/or low-switch (s) may be applied in a wide range of applications such as industrial applications, automotive applications, trucks and agriculture, power train, safety offering a variety of functions such as protection functions like over-temperature, short-circuit, overload, current limitation, open load detection, control of small loads like relays, LEDs, small motors, drive of a bulb or LED, drive of a various range of loads from relays, injector valves, oxygen probe heaters and general purpose solenoids, for example.

Embodiments of the lateral DMOSFET described herein allow for an improved self-protection and safe operating area (SPA) by decreasing a maximum temperature in or around the drain region 116 during ESD stress or any kind of stress leading to excessive or critical heating within the LDMOSFET.

Figure 2:
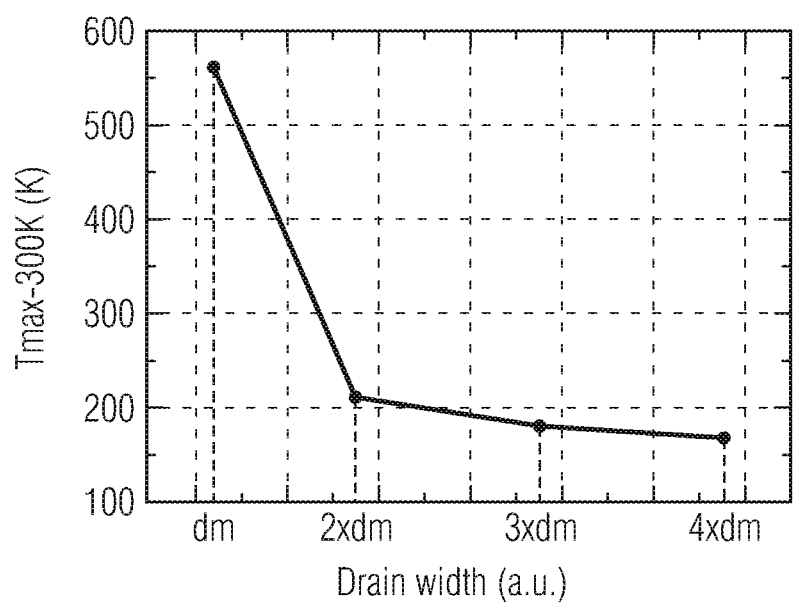
FIG. 2 is a graph illustrating a simulated maximum temperature versus a drain width of a lateral LDMOSFET stressed by a 6A transmission line pulse (TLP).

The graph of FIG. 2 is a technology computer aided design (TCAD) simulation of a maximum temperature versus the lateral dimension d of the drain region 116 of a 45 V voltage class lateral DMOSFET at a gate to source voltage of 16 V and a transmission line pulse (TIP) stress current $I_{TLP}$ of 6 A. An increase of the drain width, i.e. the lateral dimension of the drain region above the minimum lateral dimension dm allows for a decrease of the maximum temperature occurring in the lateral DMOSFET in or around the drain region 116. Thus, self-protection capabilities and SOA can be improved.

Figure 3:
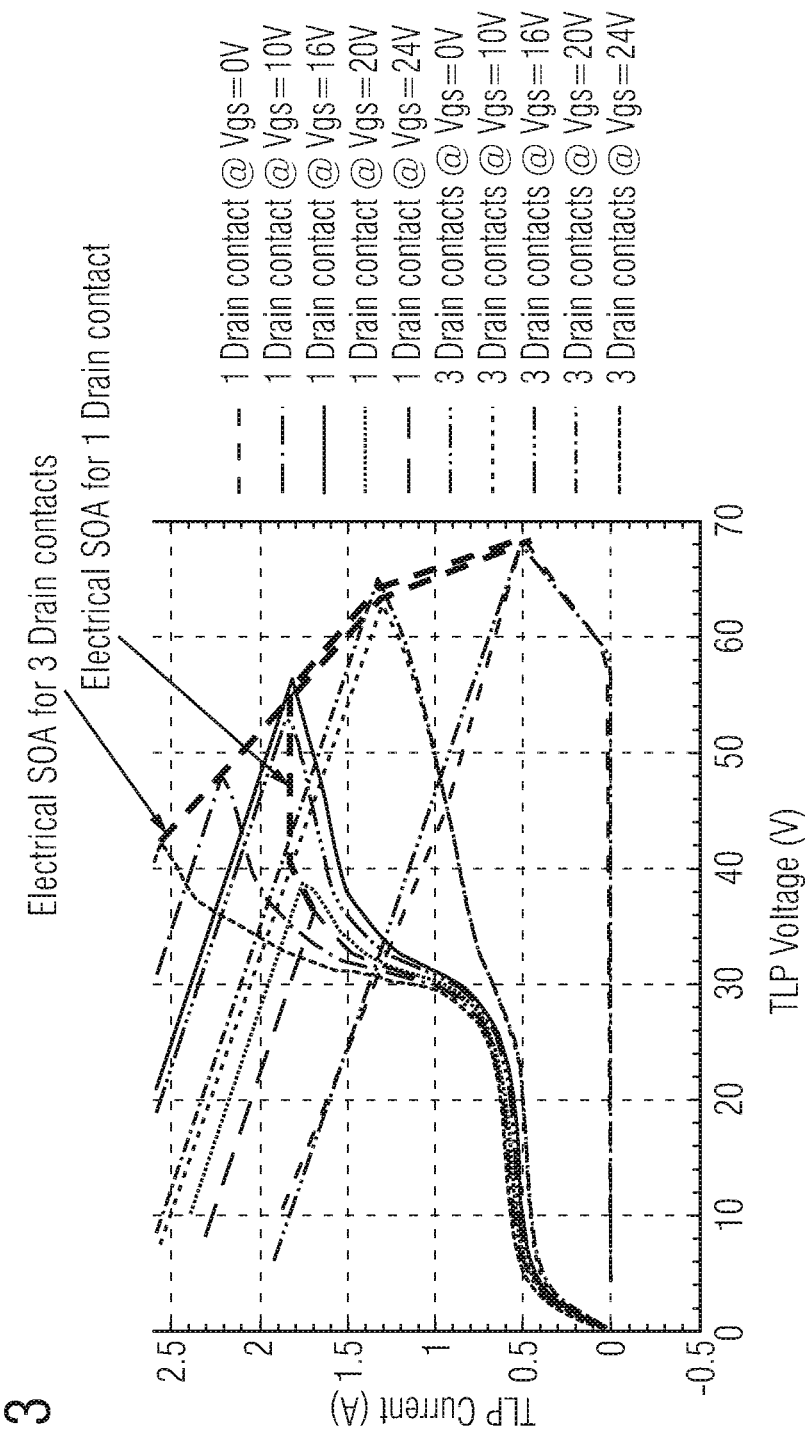
FIG. 3 is a graph illustrating current vs. voltage curves of lateral DMOSFETs having different drain widths and stressed by transmission line pulses (TIP).

The graph of FIG. 3 illustrates TIP current versus TIP voltage for a lateral DMOSFET having the minimum lateral dimension of the drain region (curves denoted. "1 Drain contact" corresponding to a drain width of dm) and a lateral DMOSFET having a lateral dimension of the drain region of 3×dm. (curves denoted "3 Drain contacts"). An increase of the lateral dimension of the drain region 116 above the minimum dimension dm allows for an improved SPA. Different TIP curves for each lateral DMOSFET category, i.e. minimum drain width dm and drain width of 3×dm are associated with different gate to source voltages $V_{gs}$ during TLP stress. An increase of failure current with increasing $V_{gs}$ is due to a contribution of an increase conductivity in the channel region 122 during the TIP stress caused by the applied gate to source voltage $V_{gs}$.

In some embodiments, the lateral DMOSFET further 108 comprises a dielectric structure extending into the semiconductor body 106 at the first surface 104 between the drain region 116 and a channel region 122.

Figure 4A:
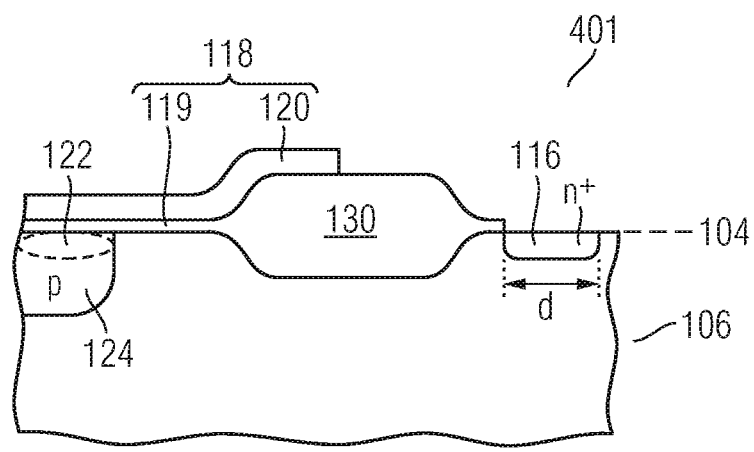
FIGS. 4A, and 4B are schematic cross-sectional views of a lateral DMOSFET including an increased drain width and a dielectric structure between the drain region and a channel region.

In the schematic cross-sectional view 401 of the lateral DMOSFET illustrated in FIG. 4A, the dielectric structure is a local oxidation of silicon (LOCOS) structure 130. The LOCOS structure 130 includes a lower part below the first surface 104 and an upper part above the first surface 104.

Figure 4B:
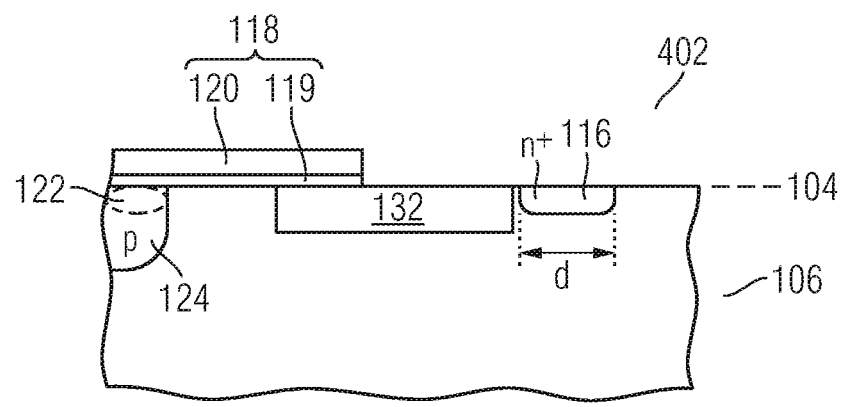

In the schematic cross-sectional view 402 of the lateral DMOSFET illustrated in FIG. 4B, the dielectric, structure is a shallow trench isolation (STI) structure 132.

In some embodiments, the dielectric structure, for example the LOCOS structure 130 illustrated in FIG. 4A or the STI structure 132 illustrated in FIG. 4B and the planar gate structure 118 of the lateral DMOSFET partly overlap at the first surface 104.

Provision of the dielectric structure provides the technical benefit of improving the voltage blocking capabilities by extending the electric field from the semiconductor body 106 into the dielectric structure at blocking voltages between source and drain or gate and drain of the lateral DMOSFET.

In some embodiments, the integrated circuit further comprising at least two contact plugs or at least two contact stripes subsequently arranged one after another along a lateral direction x. The lateral direction x extends from the source region 126 to the drain region 116, and the at least two contact plugs or at least two contact stripes are electrically connected to the drain region 116.

The schematic cross-sectional view 500 of FIG. 5A illustrates an embodiment of a lateral DMOSFET having two contact plugs 134 or two contact stripes 136 subsequently arranged one after another along the lateral direction x. The two contact plugs 134 or the two contact stripes 136 extend through openings in an intermediate dielectric 138.

The schematic top view 501 of FIG. 5B is one embodiment of a top view of FIG. 5A. Two contact plugs 134 are subsequently arranged one after another along the lateral direction H. The contact plugs 134 are also subsequently arranged along a lateral direction y forming two parallel contact plug rows.

The schematic top view 501 of FIG. 5C is another embodiment of a top view of FIG. 5A illustrating two contact stripes 136 subsequently arranged one after another along the lateral direction x and parallel along the lateral direction y.

In some embodiments, the integrated circuit further comprises a second lateral DMOSFET, wherein a minimum lateral dimension of a drain region of the second lateral DMOSFET at the first surface 104 of the semiconductor body 106 equals the minimum lateral dimension dm. The semiconductor well 102 illustrated in FIG. 1 may constitute the drain region of the second lateral DMOSFET. In some embodiments, the second lateral DMOSFET may be part of a trigger circuit, for example a dynamically triggered active clamp of the lateral DMOSFET. The second lateral DMOSFET may also be part or another circuit block of the integrated circuit.

In some embodiments, the integrated circuit further comprises a body region including at least first and second body sub-regions, the first body sub-region being buried within the semiconductor body.

Figure 6:
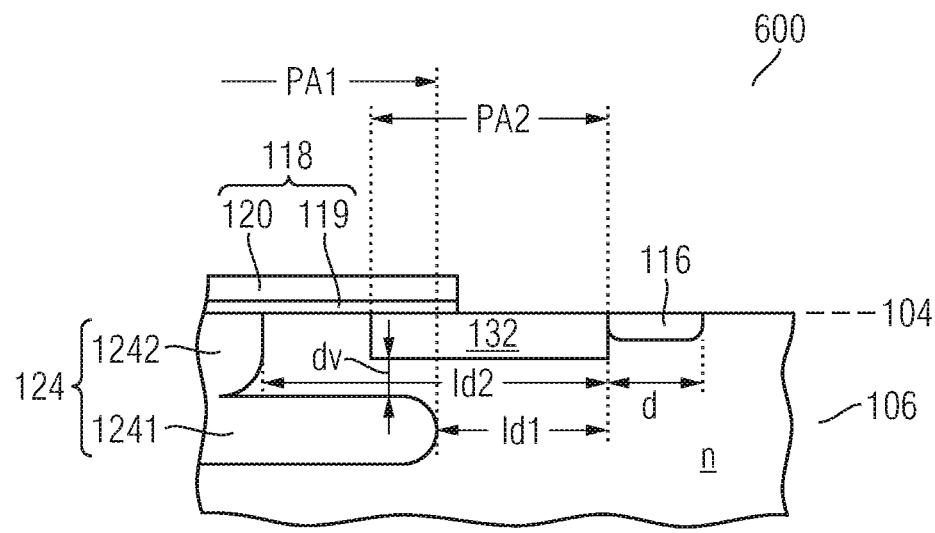
FIG. 6 is a schematic cross-sectional view of a semiconductor body including lateral DMOSFET including a buried part of a semiconductor body.

In the schematic cross-sectional view 600 of FIG. 6, a first lateral distance 1d1 between the drain region 116 and a first body sub-region 1241 of the body region 124 is smaller than a second lateral distance 1d2 between the drain region 116 and a second body sub-region 1242. The part of the first body sub-region 1241 protruding the second body sub-region 1242 and a part of the semiconductor body 106 above the first body sub-region act as a charge compensation structure similar to super-junction semiconductor devices. Thereby, a trade-off between a voltage blocking capability of the lateral DMOSFET and an on-state resistance can be improved. Apart from the first and second body sub-regions 1241, 1242, additional body-subregions may be arranged, the two or more body-subregions overlapping with each other to form the body region 124. In some embodiments, a third body-region may be arranged vertically between first and second body sub-regions spaced apart from each other, the third body sub-region overlapping with a lower part of the second body sub-region and overlapping with an upper part of the first body sub-region, for example.

In some embodiments, a projection area PA1 of the first body sub-region 1241 onto the first surface 104 and a projection area PA2 of the dielectric structure 132 onto the first surface 104 overlap. Thereby, an electric field profile between the channel region and the drain region may be further improved. Technical benefits, for example decrease of on-state resistance, increase of source to drain breakdown voltage, improve of electrical SOA during discharge events may result.

In some embodiments, a minimum vertical distance dv between the dielectric structure 132 and the first body sub-region 1241 is smaller than the minimum lateral dimension d of the drain region 116 of the lateral DMOSFET. This allows to shift a maximum heat spot caused by current or voltage pulses such as ESD or overcurrents away from the drain region 116 of the lateral DMOSFET.

In some embodiments, a specified maximum drain to source voltage VIDE; of the first lateral DMOSFET ranges between 10 V and 800 V, or between 20 V and 200V.

The maximum drain to source voltage $V_{DS}$ may be taken from a data sheet of the integrated circuit, for example specified as maximum absolute ratings.

In some embodiments, at least one of a source terminal and a drain terminal of the first lateral DMOSFET is electrically connected to a pin of the integrated circuit. As an example, the pin may be the load pin and/or a supply pin. For high- and/or low-side switches, the pin may be an output pin to drive a load element such as a LED or a motor.

In some embodiments, the integrated circuit further comprises a trigger circuit configured to switch the first lateral DMOSFET in an on-state when a voltage between source and drain terminals of the first lateral DMOSFET exceeds a trigger voltage.

Figure 7:
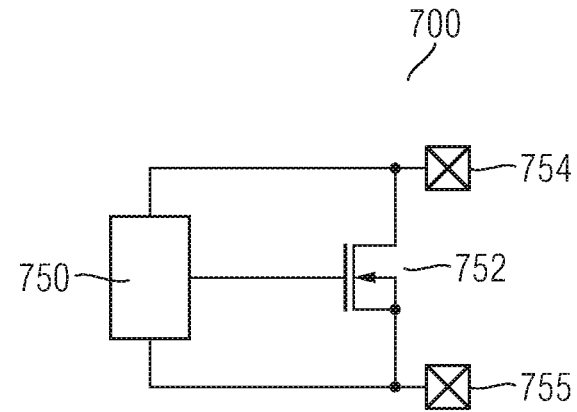
FIG. 7 is a schematic circuit diagram of an integrated circuit including a lateral DMOSFET and a trigger circuit.

In the schematic circuit diagram 700 of FIG. 7, a trigger circuit 750 is electrically coupled to a lateral DMOSFET 752. An embodiment of the lateral DMOSFET 752 is illustrated in the schematic cross-sectional view 100 of FIG. 1. The lateral DMOSFET 752 may also be formed according to other embodiments described herein. The lateral DMOSFET 752 is electrically connected between pins 754, 755. In a low-side switch, the pin 754 may be an output pin for driving a load and the pin 755 may a supply pin such as ground (GND), for example. In a high-side switch, the pin 754 may be a supply pin such as a battery pin and the pin 755 may an output pin for driving a load, for example.

The trigger circuit 750 may include at least one series connection of Zener diodes. The trigger circuit may also include at least one third lateral DMOSFET, wherein a minimum lateral dimension of a drain region of the third lateral DMOSFET at the first surface of the semiconductor body equals the minimum lateral dimension dm. In some embodiments, channel conductivity types of the at least one third lateral DMOSFET and the first lateral DMOSFET are different. In some other embodiments, channel conductivity types of the at least one third lateral DMOSFET and the first lateral DMOSFET are equal.

Figure 8:
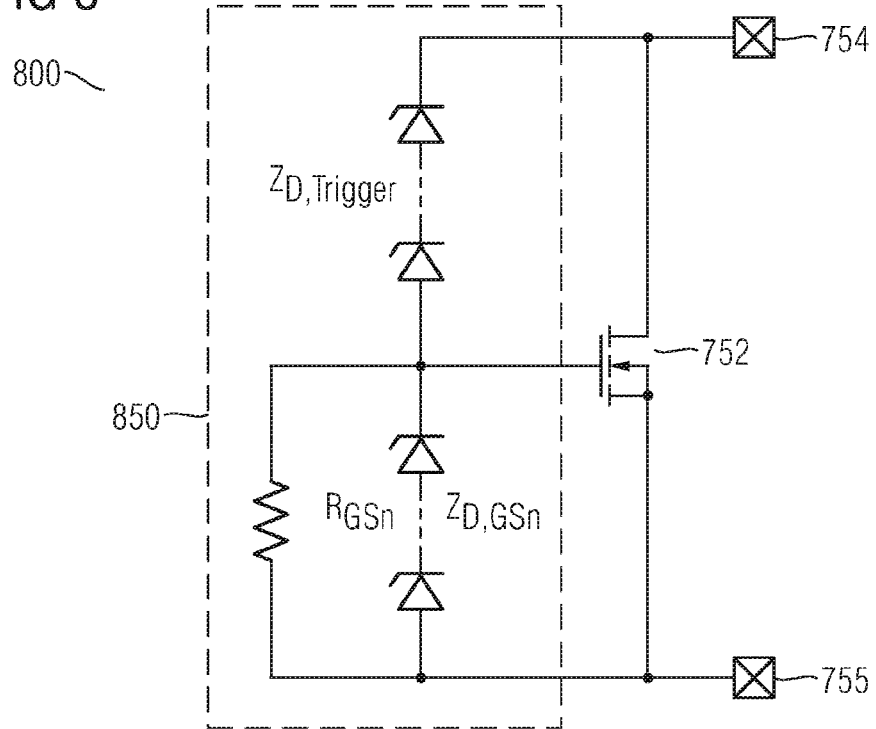
FIGS. 8, 9 and 10 are circuit diagrams illustrating different embodiments of the trigger circuit of FIG. 7.

A schematic circuit diagram 800 illustrated in FIG. 8 includes the lateral DMOSFET 752 as a protective device in the integrated circuit conducting ESD current between the pins 754, 755. A trigger circuit 850 is an active clamp and constitutes an embodiment of the trigger circuit 750 of FIG. 7 designed to control a gate to source voltage $V_{GS}$ of the lateral DMOSFET 752. A Zener diode string $Z_{D,trigger}$ defines a threshold voltage $V_{tr}$ at which the active clamp is switched to a conducting or non-conducting state. A Zener diode protection $Z_{D,GSn}$ prevents overdriving of the lateral DMOSFET 752. A bias resistor $R_{GSn}$ provides a defined gate to source discharge time constant for a drain to source voltage smaller than Vtr, and on the other hand maintains the designed gate to source voltage if the active clamp is in the conducting state. The Zener diode string may include forward and reverse biased Zener diodes in order to achieve a desired value of a total breakdown voltage of the string. Also, the gate to source voltage can be limited by such a type of Zener diode string.

Figure 9:
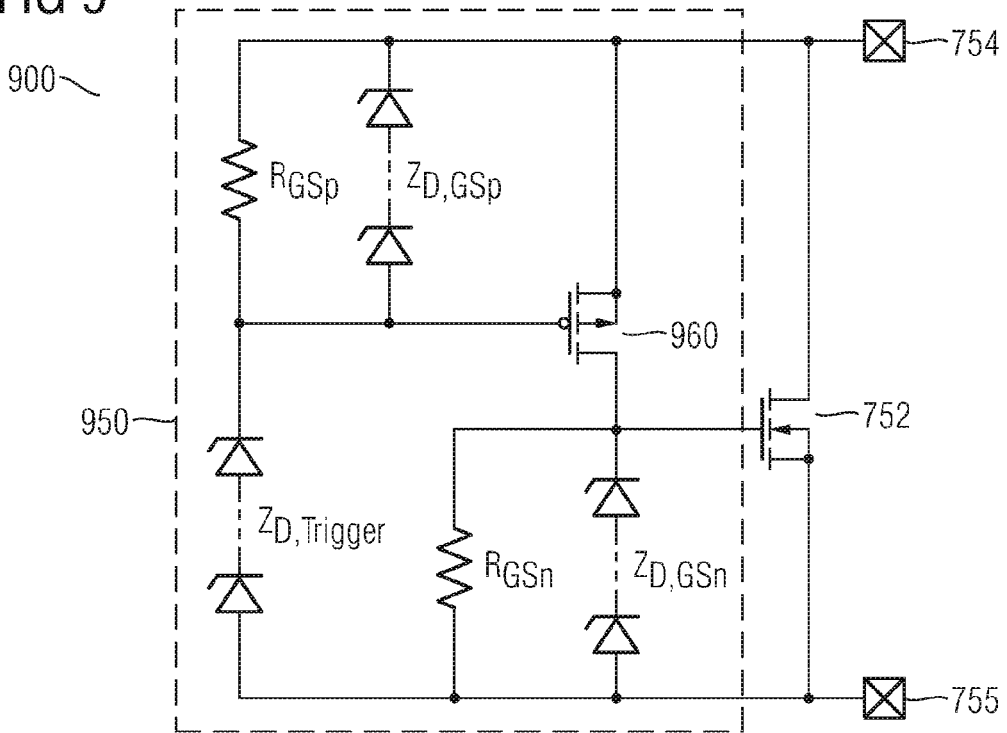

FIG. 9 illustrates another embodiment of a circuit diagram 900 including a trigger circuit 950 acting as an active clamp designed to control a gate to source voltage $V_{GS}$ of the lateral DMOSFET 752. For improving $V_{GS}$ control, an amplification stage is implemented. The trigger circuit 950 employs a Zener diode string $Z_{D,trigger}$ for trigger voltage definition and a further lateral DMOSFET 960 as a current source driving the lateral DMOSFET 752 during ESD stress. The further lateral DMOSFET 960 is one example of a lateral DMOSFET that includes a minimum lateral dimension of a drain region at the first surface of the semiconductor body that equals the minimum lateral dimension dm. Optional Zener protection diodes $Z_{D,GSn}$ and $Z_{D,GSp}$ protect the lateral DMOSFETs, 752, 960 from overvoltage at the gate.

Figure 10:
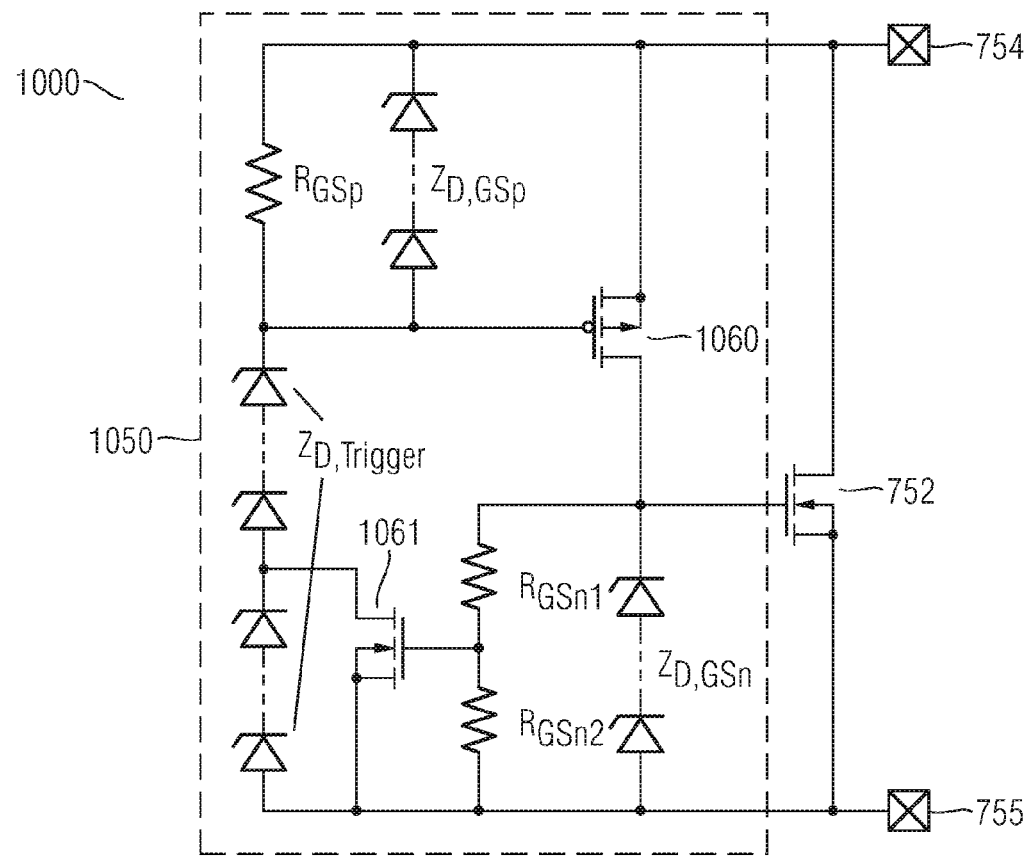

FIG. 10 illustrates another embodiment of a trigger circuit 1050 of a circuit diagram 1000 acting as an active clamp designed to control a gate to source voltage $V_{GS}$ of the lateral DMOSFET 752. The trigger circuit 1050 works in the same way as the trigger circuit 950 illustrated in FIG. 9 in an operation state where a lateral DMOSFET 1061 is turned-off. A lateral DMOSFET 1060 is similar to the lateral DMOSFET 960 illustrated in FIG. 9. Once a threshold voltage of the lateral DMOSFET 1061 is reached, a part of $Z_{D,trigger}$ having a breakdown voltage $V_{short}$ is bypassed. The lateral DMOSFET 1061 operates in its linear region and acts as a resistor, for example conducting in the mA range. The lateral DMOSFET 1061 is then forced to switch to another operating point and shows a snapback behavior in its quasi-static current vs. voltage curve. Once the snapback-mode is established, the on-state resistance of the clamp remains nearly unchanged because a resistance of the lateral DMOSFET 1061 is much smaller than $R_{GSp}$, and thus can be neglected. A remaining part of $Z_{D,trigger}$ having a breakdown voltage Vremain and the drain to source voltage of the lateral DMOSFET 1061 define a holding voltage Vh of the clamp Vh=Vremain+VDS2. A voltage divider including resistors RGSn1 and RGSn2 serves to control an onset of the snapback depending on the threshold voltage of the lateral DMOSFET 1061. Hence, trigger current and voltage of the snapback are circuit design parameters. An appropriate setting of these design parameters prevents false-triggering in order to fulfill electrical overstress (EOS) electromagnetic compatibility (EMC) requirements. Prevention of the snapback during non-ESD pulses does not aim to protect the clamp from destruction but to avoid disturbance of the functional signals. Without involving any bipolar snapping mechanism, the clamp will not encounter the problems a bipolar snapping device usually deals with, such as current filaments, voltage overshoots etc. Benefits of the trigger circuit 1050 include a low ESD window consumption as well as a maximum utilization of the SOA of the lateral DMOSFET 752.

Figure 11:
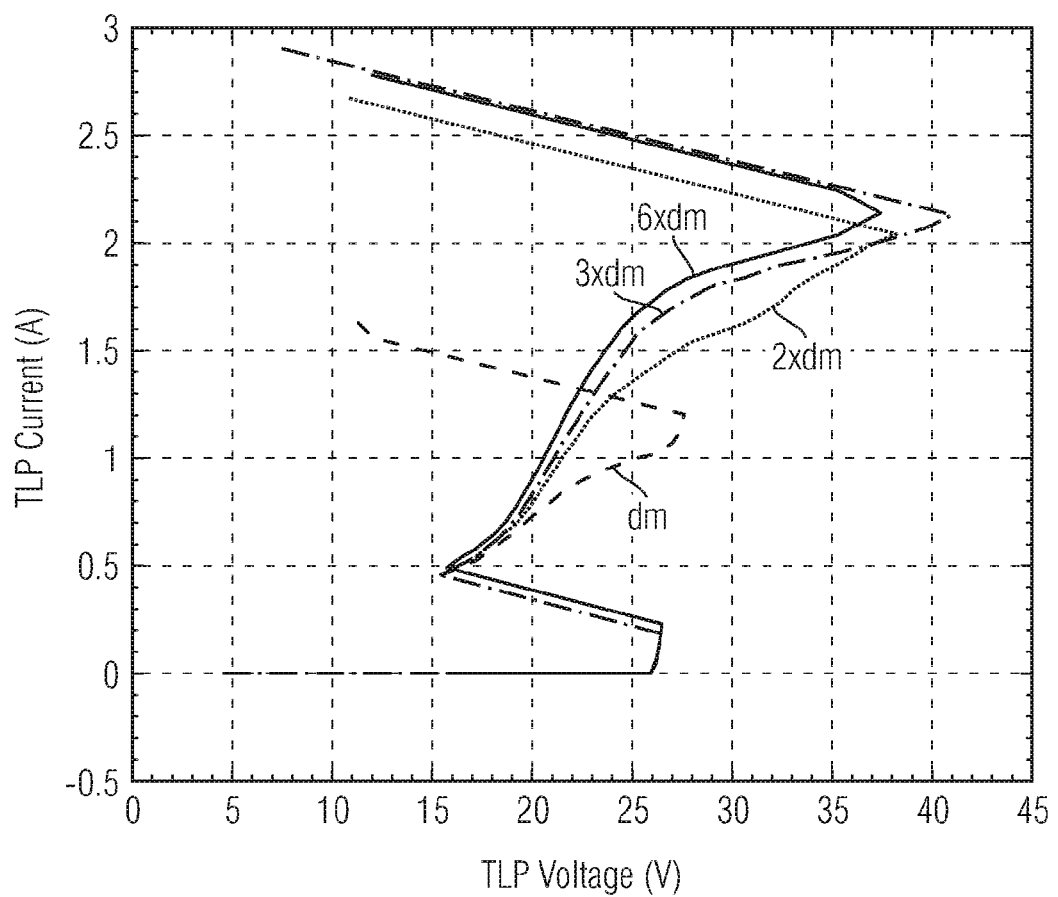
FIG. 11 is a graph illustrating current vs. voltage curves of active-clamped lateral DMOSFETs having different drain widths and stressed by transmission line pulses (TIP).

The graph of FIG. 11 illustrates TIP current versus TIP voltage for a lateral DMOSFET having the minimum lateral dimension dm of the drain region including one contact along the lateral direction x, a lateral DMOSFET having a lateral dimension of the drain region of 2×dm including two contacts disposed one after another along the lateral direction x, a lateral DMOSFET having a lateral dimension of the drain region of 3×dm including three contacts disposed one after another along the lateral direction x, and a lateral DMOSFET having a lateral dimension of the drain region of 6×dm including six contacts disposed one after another along the lateral direction x. An increase of the lateral dimension of the drain region 116 above the minimum dimension dm allows for an improved SOA.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
   a semiconductor well having a minimum width at a first surface of a semiconductor body; and
   a first lateral DMOSFET comprising a load path electrically coupled to a load pin, the first lateral DMOSFET being configured to control a load current through a load element electrically coupled to the load pin,
   wherein a minimum width of a drain region of the first lateral DMOSFET at the first surface of the semiconductor body is more than 50% greater than the minimum width of the semiconductor well at the first surface of the semiconductor body,
   wherein the semiconductor well is spaced apart from the drain region of the first lateral DMOSFET and does not form part of the first lateral DMOSFET.

2. The integrated circuit of claim 1, wherein the lateral DMOSFET further comprises a dielectric structure extending into the semiconductor body at the first surface between the drain region and a channel region.

3. The integrated circuit of claim 2, wherein the dielectric structure is a shallow trench isolation structure or a LOCOS structure.

4. The integrated circuit of claim 2, wherein the dielectric structure and a gate structure of the lateral DMOSFET partly overlap at the first surface.

5. The integrated circuit of claim 1, further comprising at least two contact plugs or at least two contact stripes arranged one after another along a lateral direction, wherein the lateral direction extends from a source region to the drain region, and the least two contact plugs or at least two contact stripes are electrically connected to the drain region.

6. The integrated circuit of claim 1, further comprising a second lateral DMOSFET, wherein a minimum width of a drain region of the second lateral DMOSFET at the first surface of the semiconductor body equals the minimum width of the semiconductor well at the first surface of the semiconductor body.

7. The integrated circuit of claim 1, further comprising a body region including at least first and second body sub-regions, the first body sub-region being buried within the semiconductor body.

8. The integrated circuit of claim 7, wherein a first lateral distance between the first body sub-region and the drain region is smaller than a second lateral distance between the second body sub-region and the drain region.

9. The integrated circuit of claim 8, further comprising a dielectric structure extending into the semiconductor body at the first surface between the drain region and a channel region, wherein a projection area of the first body sub-region onto the first surface and a projection area of the dielectric structure onto the first surface overlap.

10. The integrated circuit of claim 9, wherein a minimum vertical distance between the dielectric structure and the first body sub-region is smaller than the minimum width of the drain region of the first lateral DMOSFET at the first surface of the semiconductor body.

11. The integrated circuit of claim 1, wherein a specified maximum drain to source voltage of the first lateral DMOSFET ranges between 10 V and 800 V.

12. The integrated circuit of claim 1, wherein at least one of a source terminal and a drain terminal of the first lateral DMOSFET is electrically connected to a pin of the integrated circuit.

13. The integrated circuit of claim 12, wherein the pin is the load pin and/or a supply pin.

14. The integrated circuit of claim 1, further comprising a trigger circuit configured to switch the first lateral DMOSFET in an on-state when a voltage between source and drain terminals of the first lateral DMOSFET exceeds a trigger voltage.

15. The integrated circuit of claim 14, wherein the trigger circuit comprises at least one series connection of Zener diodes.

16. The integrated circuit of claim 14, wherein the trigger circuit comprises at least one third lateral DMOSFET, wherein a minimum width of a drain region of the at least one third lateral DMOSFET at the first surface of the semiconductor body equals the minimum width of the semiconductor well at the first surface of the semiconductor body.

17. A load system, comprising:
   an integrated circuit, comprising:
   a semiconductor well having a minimum width at a first surface of a semiconductor body; and
   a first lateral DMOSFET comprising a load path electrically coupled to a load pin, the first lateral DMOSFET being configured to control a load current through a load element electrically coupled to the load pin,
   wherein a minimum width of a drain region of the first lateral DMOSFET at the first surface of the semiconductor body is more than 50% greater than the minimum width of the semiconductor well at the first surface of the semiconductor body,
   wherein the semiconductor well is spaced apart from the drain region of the first lateral DMOSFET and does not form part of the first lateral DMOSFET; and
   a load electrically coupled to the load pin.

18. The load system of claim 17, wherein the load is one of a motor, an inductive load, a resistive load, a capacitive load, and a lamp.

19. The load system of claim 17, wherein the lateral DMOSFET further comprises a dielectric structure extending into the semiconductor body at the first surface between the drain region and a channel region.

20. The load system of claim 17, wherein the integrated circuit further comprises a body region including at least first and second body sub-regions, the first body sub-region being buried within the semiconductor body.

21. The integrated circuit of claim 1, wherein the semiconductor well and the drain region of the first lateral DMOSFET have the same conductivity type.

22. The integrated circuit of claim 21, wherein the semiconductor well and the drain region of the first lateral DMOSFET are n-doped.

23. The integrated circuit of claim 1, wherein the minimum width of the semiconductor well at the first surface of the semiconductor body is a minimum photolithographic width.

24. The load system of claim 17, wherein the semiconductor well and the drain region of the first lateral DMOSFET have the same conductivity type.

25. The load system of claim 24, wherein the semiconductor well and the drain region of the first lateral DMOSFET are n-doped.

26. The load system of claim 17, wherein the minimum width of the semiconductor well at the first surface of the semiconductor body is a minimum photolithographic width.

27. An integrated circuit, comprising:
   a semiconductor well having a minimum width at a first surface of a semiconductor body; and
   a first lateral DMOSFET comprising a load path electrically coupled to a load pin and a dielectric structure extending into the semiconductor body at the first surface between the drain region and a channel region, the first lateral DMOSFET being configured to control a load current through a load element electrically coupled to the load pin,
   wherein a minimum width of a drain region of the first lateral DMOSFET at the first surface of the semiconductor body is more than 50% greater than the minimum width of the semiconductor well at the first surface of the semiconductor body.

* * * * *

UNITED STATES PATENT AND TRADEMARK OFFICE
CERTIFICATE OF CORRECTION

PATENT NO. : 9,899,367 B2
APPLICATION NO. : 15/153276
DATED : February 20, 2018
INVENTOR(S) : K. Esmark et al.

It is certified that error appears in the above-identified patent and that said Letters Patent is hereby corrected as shown below:

In the Claims

Column 9, Line 53 (Claim 5, Line 5), please change "the least" to -- the at least --.

Signed and Sealed this
Twenty-fourth Day of April, 2018

Andrei Iancu
*Director of the United States Patent and Trademark Office*